United States Patent
Seler et al.

(10) Patent No.: US 9,356,332 B2
(45) Date of Patent: May 31, 2016

(54) INTEGRATED-CIRCUIT MODULE WITH WAVEGUIDE TRANSITION ELEMENT

(71) Applicant: Infineon Technologies AG, Neubiberg (DE)

(72) Inventors: Ernst Seler, Munich (DE); Maciej Wojnowski, Munich (DE); Walter Hartner, Bab Abbach (DE)

(73) Assignee: Infineon Technologies AG, Neubiberg (DE)

( * ) Notice: Subject to any disclaimer, the term of this patent is extended or adjusted under 35 U.S.C. 154(b) by 177 days.

(21) Appl. No.: 13/872,718

(22) Filed: Apr. 29, 2013

(65) Prior Publication Data
US 2014/0320231 A1    Oct. 30, 2014

(51) Int. Cl.
| | |
|---|---|
| *H03H 5/00* | (2006.01) |
| *H01P 5/08* | (2006.01) |
| *H01L 21/56* | (2006.01) |
| *H01P 1/16* | (2006.01) |
| *H01L 23/66* | (2006.01) |
| *H01L 23/00* | (2006.01) |
| *H01P 3/12* | (2006.01) |
| *H01P 5/107* | (2006.01) |
| *H01L 23/31* | (2006.01) |

(52) U.S. Cl.
CPC *H01P 5/08* (2013.01); *H01L 21/56* (2013.01); *H01L 23/66* (2013.01); *H01L 24/19* (2013.01); *H01L 24/25* (2013.01); *H01P 1/16* (2013.01); *H01P 3/121* (2013.01); *H01P 5/107* (2013.01); *H01L 21/568* (2013.01); *H01L 23/3128* (2013.01); *H01L 2223/6633* (2013.01); *H01L 2223/6677* (2013.01); *H01L 2224/12105* (2013.01); *H01L 2224/13* (2013.01); *H01L 2224/21* (2013.01); *H01L 2224/221* (2013.01); *H01L 2224/24195* (2013.01); *H01L 2224/2518* (2013.01); *H01L 2924/1421* (2013.01); *H01L 2924/1461* (2013.01); *H01L 2924/15311* (2013.01); *H01L 2924/181* (2013.01)

(58) Field of Classification Search
None
See application file for complete search history.

(56) References Cited

U.S. PATENT DOCUMENTS 7,307,493 B2 * 12/2007 Feldman ............... 333/117
8,237,259 B2    8/2012 Pressel et al.
(Continued)

OTHER PUBLICATIONS

Vahidpour et al. "In-plane cavity-backed coplanar waveguide to rectangular waveguide transition." IET Microwaves, Antennas & Propogation, vol. 6, Issue 4. The Institution of Engineering and Technology, 2012. pp. 443-449.
(Continued)

*Primary Examiner* — Lincoln Donovan
*Assistant Examiner* — Khareem E Almo
(74) *Attorney, Agent, or Firm* — Murphy, Bilak & Homiller, PLLC

(57) ABSTRACT

An integrated-circuit module includes a package molding compound layer, a radio-frequency (RF) integrated circuit embedded within the package molding compound layer and having an RF port, a waveguide transition structure embedded within the package molding compound layer, and a redistribution layer. The waveguide transition structure includes a transmission line interface section, a waveguide interface section configured for coupling to a rectangular waveguide housing, and a transformer section configured to provide a mode transition between the transmission line interface section and the waveguide interface section. The redistribution layer includes at least one insulating layer and at least one metallization layer, extending between the RF integrated circuit and the waveguide transition structure across a surface of the package molding compound layer. The first redistribution layer includes an RF transmission line conductively connected between the RF port of the RF integrated circuit and the transmission line interface section of the waveguide transition structure.

18 Claims, 17 Drawing Sheets

(56) References Cited

U.S. PATENT DOCUMENTS

2006/0091974 A1* 5/2006 Feldman .................. 333/117
2008/0129409 A1   6/2008 Nagaishi et al.
2012/0248587 A1  10/2012 Alleaume et al.
2012/0256796 A1  10/2012 Leiba

OTHER PUBLICATIONS

Jin et al. "Next Generation eWLB (embedded Wafer Level BGA) Packaging." 12th Electronics Packaging Technology Conference. IEEE, 2010. pp. 520-526.

* cited by examiner

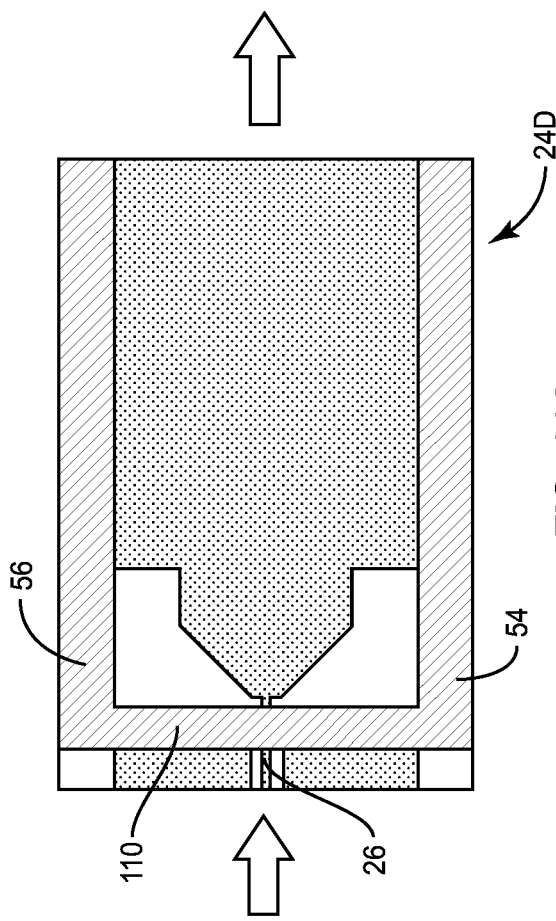
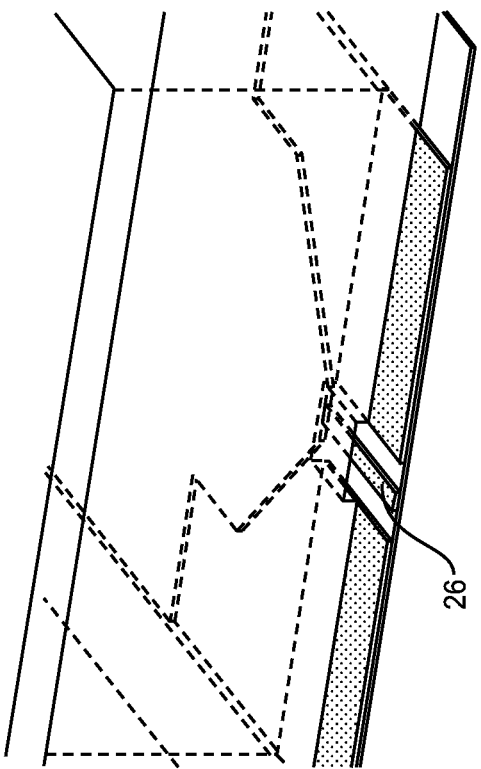
FIG. 11A
FIG. 11B

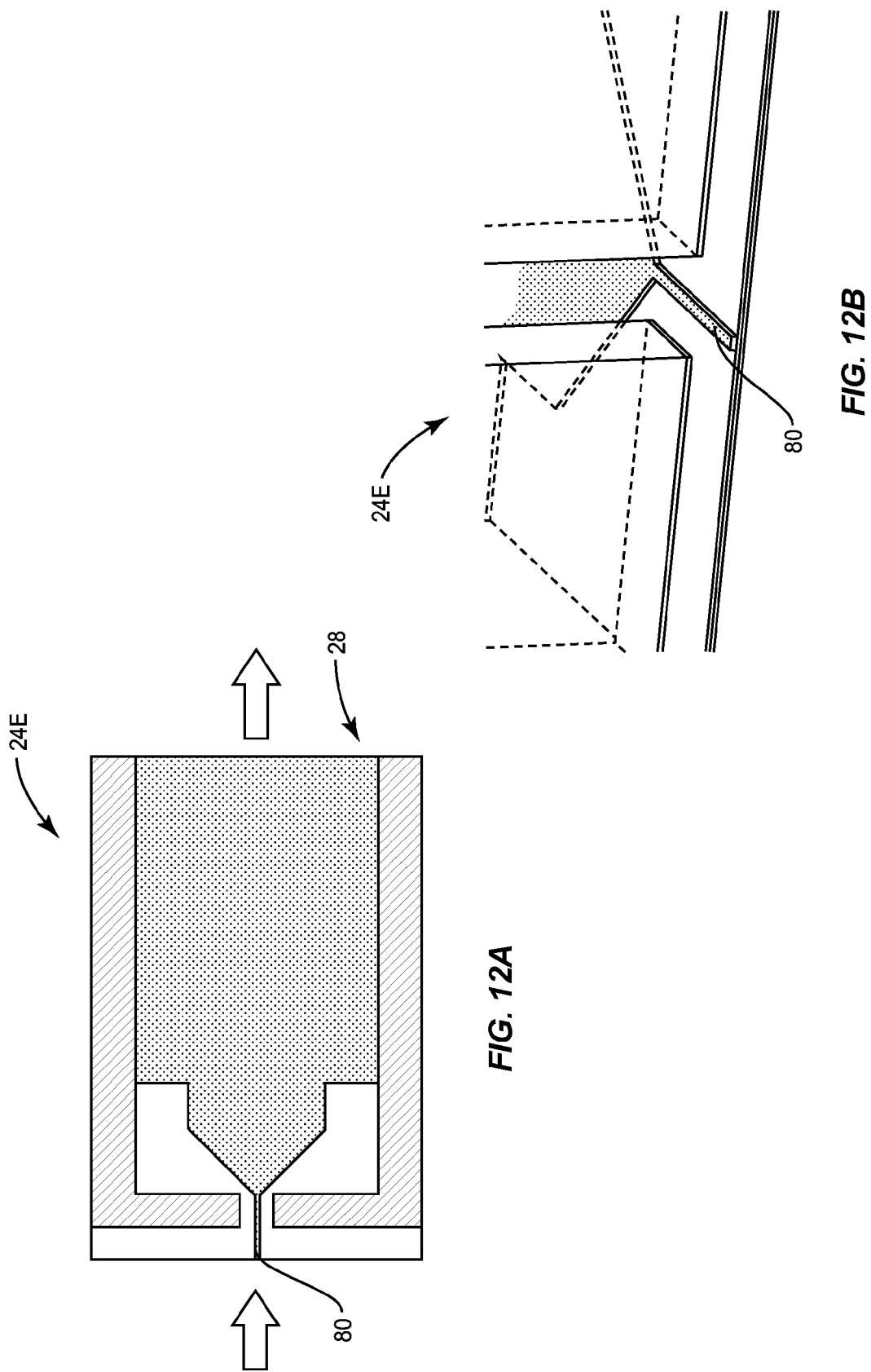

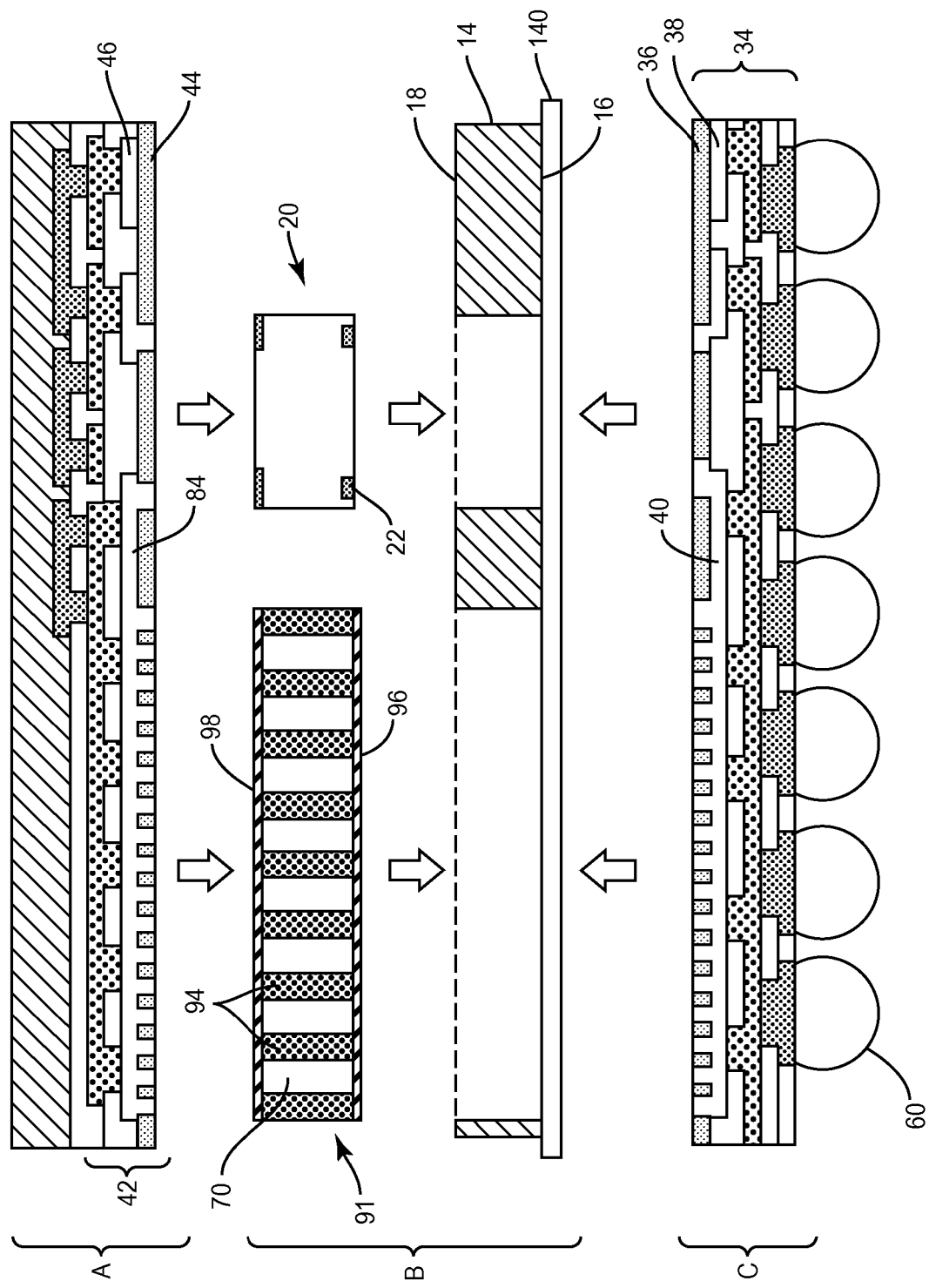

INTEGRATED-CIRCUIT MODULE WITH WAVEGUIDE TRANSITION ELEMENT

TECHNICAL FIELD

The present application relates to integrated-circuit modules, and in particular to radio-frequency integrated-circuit modules.

BACKGROUND

As the complexity of integrated circuits continues to grow, improved packaging technologies have been developed to keep pace with the increasing circuit densities and the increasing numbers of interconnects. For example, one of these techniques, known as embedded wafer level ball grid array (eWLB), was developed to support the fan-out of densely spaced integrated-circuit terminals to the solder ball interconnects of a ball grid array (BGA) package.

With eWLB packaging, a processed wafer is diced and the diced chips are spaced apart on a carrier. The spaces between the chips are filled with a molding compound, which is then cured to form an artificial wafer. Thin-film technology is used to form one or more redistribution layers, which connect the pads of the integrated circuit to the package interconnects, e.g., the solder balls. The redistribution layers, which can include one or more conductive layers and intervening dielectric layers, vias between conductive layers, and the like, allow for a flexible and efficient fan-out of the integrated-circuit inputs and outputs to the packaging interconnects. U.S. Pat. No. 8,237,259 B2, titled "Embedded Chip Package" and issued 7 Aug. 2012, provides details of the eWLB packaging technique; the entire contents of the foregoing patent are incorporated herein by reference.

Radio-frequency (RF) integrated circuits (RFICs) include circuit elements that produce or operate on signals in the radio-frequency range, which, according to some definitions, extends from about a few kilohertz to 300 gigahertz (GHz) or more. It will be appreciated that that frequencies between about 1 GHz and 300 GHz are often referred to as microwave frequencies. For the purposes of this disclosure, however, the term "radio-frequency" (or RF) is used to refer broadly to signals ranging in frequency from a few megahertz (MHz) to 100 GHz or more, and more particularly to refer to signals that are typically carried from one place to another by transmission-line and/or waveguide structures that are specifically designed for the propagation of high-frequency electromagnetic waves.

RF integrated circuits create additional challenges for packaging, particularly as signal frequencies increase. RF interconnects that extend for more than very short distances are most efficiently realized using transmission line structures, such as stripline, co-planar waveguide, or microstrip structures, or waveguide structures, such as rectangular waveguides. When RF circuits are mounted on planar substrates such as printed circuit boards, for instance, they are usually coupled directly to planar transmission lines that can be easily fabricated on the same substrate or printed circuit board.

Especially at higher frequencies, it may be preferable to couple an RF circuit to a rectangular waveguides. A variety of transition element structures have been developed to couple transmission lines formed on circuit boards, e.g., microstrip, co-planar waveguide, or stripline transmission lines, to rectangular waveguides. Many of these transition elements use a vertical probe, pin or vertical small antenna to excite the electric (E) field of an electromagnetic field being transitioned from the co-planar waveguide to the rectangular waveguide. This is probe changes the propagation mode of the electromagnetic wave from the TEM mode which is used by co-planar waveguides to a transverse electromagnetic (TE) mode, such as $TE_{10}$, which can be propagated by a rectangular waveguide.

The use of vertical elements like these probes can create fabrication difficulties. The fabrication of vertical pins, probes or antennas is more complicated than the fabrication of planar structures, and usually can only be done at a lower metal resolution (e.g., larger metal pitch and diameter) in comparison to horizontal or planar structures fabricated on planar substrates. Accordingly, improved transition structures that are more compatible with advanced integrated-circuit packaging techniques are needed.

SUMMARY

Embodiments of the present invention include integrated-circuit modules and methods for producing such modules. According to an example embodiment, an integrated-circuit module comprises a package molding compound layer, which in turn comprises a package molding compound and has opposing first and second surfaces. The integrated-circuit module further comprises a radio-frequency (RF) integrated circuit embedded in the package molding compound and including an RF port, as well as a waveguide transition structure embedded in the package molding compound and including a transmission line interface section, a waveguide interface section configured for coupling to a rectangular waveguide housing, and a transformer section configured to provide a propagation mode transition between the transmission line interface section and the waveguide interface section. A first redistribution layer comprising at least one insulating layer and at least one metallization layer extends between the RF integrated circuit and the waveguide transition structure across the first surface of the package molding compound layer, and further comprises an RF transmission line that is conductively connected between the RF port of the RF integrated circuit and the transmission line interface section of the waveguide transition structure.

In an example method of fabricating an integrated-circuit module, a radio-frequency (RF) integrated circuit having an RF port is provided. Also provided is a waveguide transition structure having a transmission line interface section, a waveguide interface section configured for coupling to a rectangular waveguide housing, and a transformer section configured to provide a mode transition between the transmission line interface section and the waveguide interface section. The RF integrated circuit and the waveguide transition structure are embedded in a package molding compound layer such that the package molding compound is disposed around the RF integrated circuit and the waveguide transition structure. A first redistribution layer is formed on the first surface of the package molding compound layer, the first redistribution layer comprising at least one insulating layer and at least one metallization layer and extending between the RF integrated circuit and the waveguide transition structure, and further comprising an RF transmission line conductively connected between the RF port of the RF integrated circuit and the transmission line interface section of the waveguide transition structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined, unless they exclude each other. Embodiments are depicted in the drawings and are detailed in the description which follows.

FIGS. 10-14, which encompass FIGS. 10, 11A-11B, 12A-12B, 13A-13B, and 14A-14D, illustrate different embodiments of a waveguide transition structure.

FIG. 15 illustrates a method of manufacturing a module.

DETAILED DESCRIPTION

Figure 1:
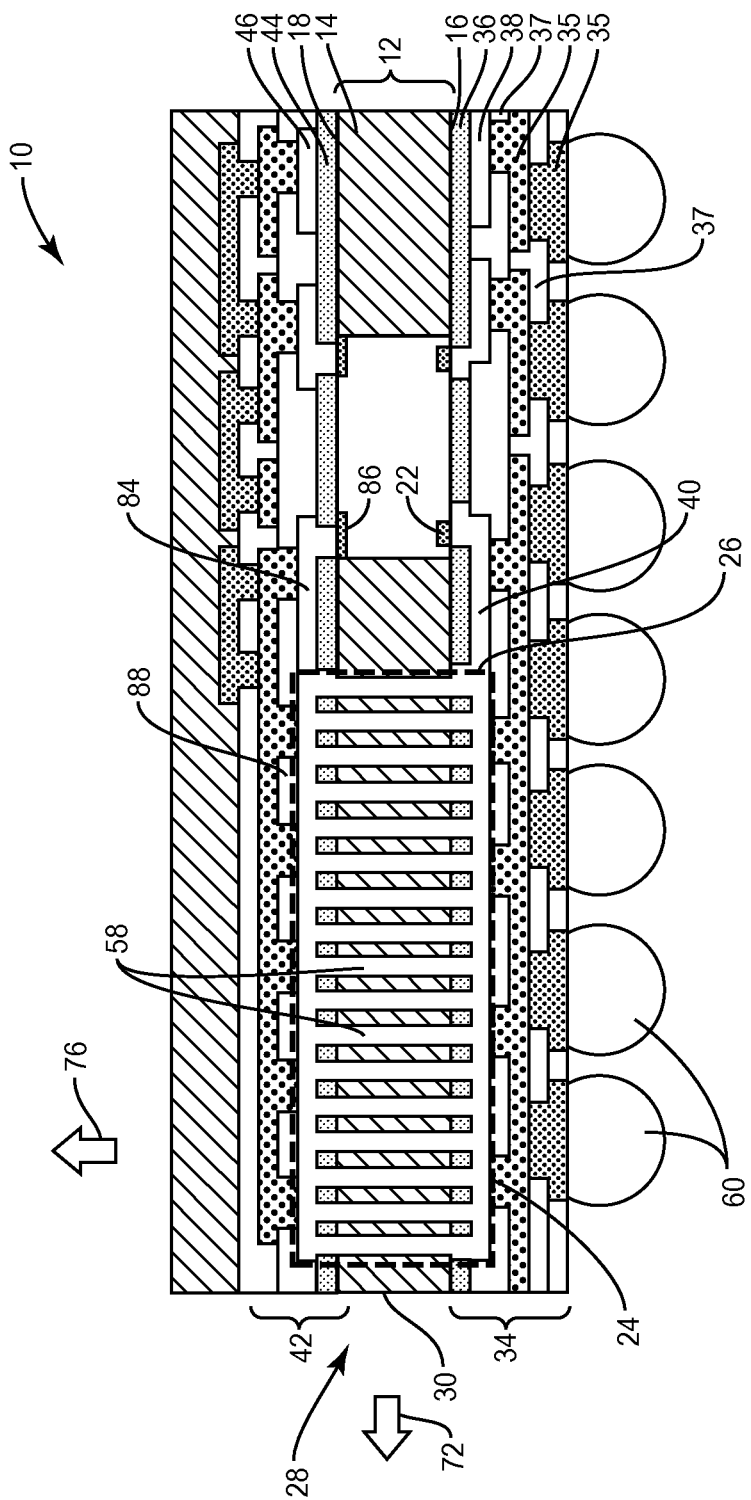
FIG. 1 illustrates a sectional side view of an embodiment of module having an internally formed waveguide transition structure.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Fan-out type packages are packages embedding a chip, wherein at least some of the package pads and/or conducting lines connecting the chip to the package pads are located laterally outside of the outline of the chip or are at least intersecting the outline of the chip. Thus, in fan-out type packages, a peripherally outer part of the package of the chip is typically (additionally) used for conductively bonding the package to external applications (e.g., application boards etc.). This outer part of the package encompassing the chip effectively enlarges the contact area of the package in relation to the footprint of the chip, thus leading to relaxed constrains in view of package pad size and pitch with regard to later processing, e.g., second level assembly.

Generally speaking, fan-out-type packages may be of various designs. The fan-out area around the chip may be provided by a surface of a mold compound used for encapsulating the chip. Another possibility is to mount the chip on a substrate (or leadframe) chip carrier having lateral dimensions larger than the chip dimensions and to exploit a peripheral region of the laminate substrate chip carrier as a fan-out area. Embodiments of the package may use various types of chips, among them logic integrated circuits, analog integrated circuits, mixed signal integrated circuits, sensor circuits, MEMS (Micro-Electro-Mechanical Systems), power integrated circuits, chips with integrated passives, passives etc. Embodiments of the substrate may include substrates of different type and configuration, in particular PCBs (Printed Circuit Boards), SBU (Sequential Build-Up) laminate substrates, ceramic substrates, leadframes and mold compounds, e.g., MIDs (Molded Interconnect Devices). Embodiments for bonding the package pads to the wiring of the substrate may include thin-film technology, soldering, welding, diffusion or bond wire technologies.

In the discussion that follows, various embodiments of the present invention are described in the context of a fan-out package that uses eWLB or similar technology, i.e., where one or more thin-film redistribution layers are arranged on the surface or surfaces of a package molding compound layer that embeds the integrated circuit chip, such that electrical contacts ("pads") on the integrated circuit chip may be conductively connected to package interconnects, such as solder ball contacts on a ball grid array (BGA) package. It will be appreciated, however, that the inventive techniques, packages, and circuit arrangements disclosed herein are not limited to the eWLB context, and may be applied to other fan-out packages and may use other technologies for forming interconnects.

Figure 2:
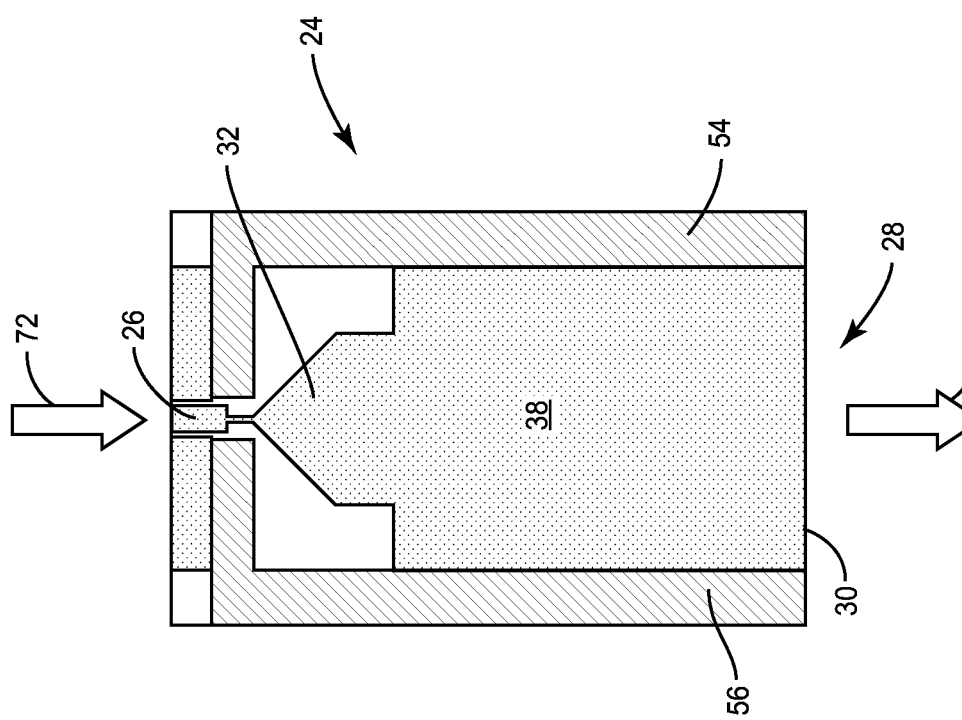
FIGS. 2-3 illustrate top and perspective views of an embodiment of the waveguide transition structure of FIG. 1.
Figure 3:
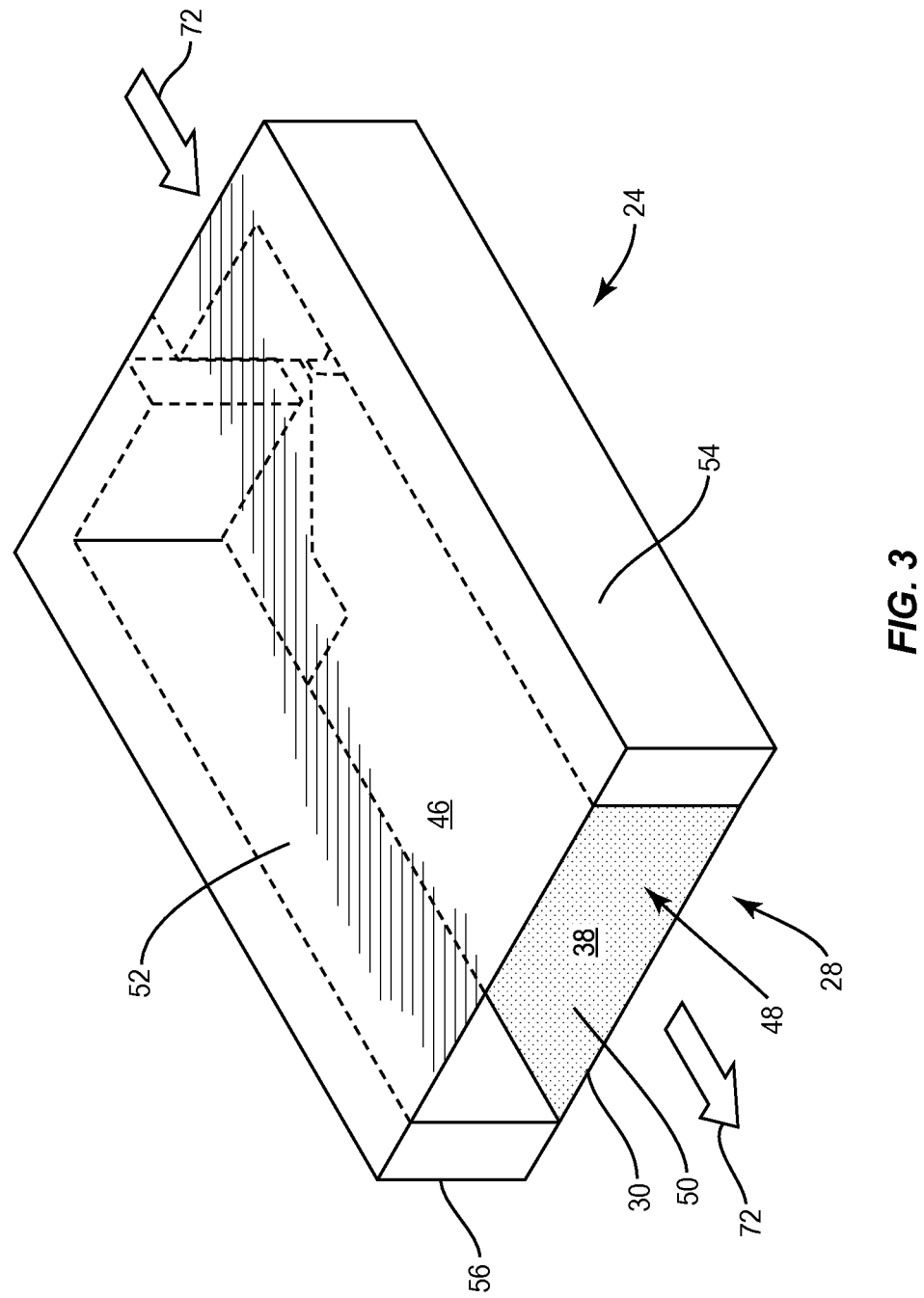

Referring first to FIGS. 1-3, FIG. 1 illustrates a sectional side view of an embodiment of an integrated-circuit module 10 having an internally formed waveguide transition structure 24, while FIGS. 2-3 illustrate top and perspective views respectively of an embodiment of the waveguide transition structure 24 illustrated in FIG. 1. Waveguide transition structure 24 is shown within a dashed outline in FIG. 1.

In the illustrated embodiments, integrated-circuit module 10 includes a package molding compound layer 12 with a radio-frequency integrated circuit (RFIC) 20 embedded therein. The package molding compound layer 12 includes a package molding compound 14 and has a first surface 16 and a second surface 18 on opposing sides of package molding compound layer 12. RFIC 20 can be any type of integrated circuit that has a radio frequency (RF) port 22, the RF port 22 providing an RF input to the RFIC 20 or an RF output from the RFIC 20. As shown in FIG. 1, RF port 22 comprises a single "pad" or contact on RFIC 20, the RF port 22 thus providing or receiving a single-ended RF signal; it will be appreciated that an RF port 22 might comprise a pair of pads or contacts in some embodiments, the pair of pads or contacts providing or receiving a differential RF signal. The integrated-circuit module 10 further includes a first redistribution layer 34 and a second redistribution layer 42. Integrated-circuit module 10 can be formed using a suitable packaging technology such as embedded wafer level ball grid array (eWLB) technology.

As noted above, packaging technologies such as eWLB enable integrated circuits and other components to be integrated into a single package structure that includes one or more redistribution layers for electrical interconnection of integrated circuit devices, like the RFIC 20 shown in FIG. 1, to package bonding structures, such as the solder balls 60 in FIG. 1. Via structures can also be incorporated into an eWLB package structure, using known techniques, whether within a given multi-layer redistribution layer, or between redistribution layers. These via structures enable interconnection of conductive layers located within a redistribution layer, such as between metallization layers 35 and 38 in first redistribution layer 34, or between conductive layers in different redistribution layers, such as between metallization layer 38 within first redistribution layer 34 and metallization layer 46 within second redistribution layer 42.

In the embodiment shown in FIGS. 1-3, integrated-circuit module 10 further includes a waveguide transition structure 24 that is embedded in the package molding compound 14. FIG. 2 provides a top-down view, with respect to the orientation shown in FIG. 1, of the waveguide transition structure 24, after removing the second redistribution layer 42, any top-side metallization layer, and any other top-side material, for clarity. FIG. 3 provides a perspective view, with a top-side conductive broadwall 52 shown. As can be seen in FIG. 2, waveguide transition structure 24 includes a transmission line interface section 26 and a waveguide interface section 28. In the illustrated embodiment, transmission line interface section 26 is configured to couple to a coplanar waveguide transmission line leading to the waveguide transition structure 24 from the RFIC 20, while the waveguide interface section 28 is configured to couple to a rectangular waveguide housing at 30. As best seen in FIG. 2, waveguide transition structure 24 includes a transformer section 32 that provides a propagation mode transition between transmission line interface section 26 and waveguide interface section 28. More particularly, the propagation mode transition converts the propagation mode for an RF electromagnetic wave from a transmission line mode to a waveguide propagation mode. In one embodiment, the mode transition is from a transverse electric mode (TEM) at transmission line interface section 26 to a waveguide mode, such as a transverse-electromagnetic (TE) or transverse-magnetic (TM) mode, at waveguide interface section 28.

First redistribution layer 34 includes an insulating layer 36 and a metallization layer 38. First redistribution layer 34 can include more than one metallization layer and more than one insulation layer; in the embodiment illustrated in FIG. 1, first redistribution layer 34 comprises two additional metallization layers 35 and two additional insulation layers 37. First redistribution layer 34 extends between RFIC 20 and waveguide transition structure 24 across the first surface 16 of package molding compound layer 12. First redistribution layer 24 includes an RF transmission line 40 that is conductively connected between RF port 22 of RFIC circuit 20 and transmission line interface section 26 of waveguide transition structure 24. Generally speaking, the RF transmission line used to interconnect the RFIC with the waveguide transition structure can be any of several types of transmission lines. In the illustrated embodiment, RF transmission line 40 is a coplanar waveguide.

Integrated-circuit module 10 includes a second redistribution layer 42 that includes an insulating layer 44 and a metallization layer 46. Second redistribution layer 42 can include more than one metallization layer 46 and more than one insulation layer 44. In the embodiment illustrated in FIG. 1, second redistribution layer 42 extends between RF integrated circuit 20 and waveguide transition structure 24 across second surface 18 of package molding compound layer 12. In some embodiments, second redistribution layer 42 is used to form a ground plane extending between RFIC 20 and the waveguide transition structure 24; in these embodiments metallization layer 46 may be connected to one or more package ground connections at or near the RFIC 20, e.g., using vias (not shown) that extend through molding compound layer 12 and connect metallization layer 46 to one or more solder balls 60 through one or more of the metallization layers in the first redistribution layer.

As seen in FIG. 3, waveguide transition structure 24 includes a cavity 48 defined by a first broadwall 50, a second broadwall 52, and first and second sidewalls 54 and 56. In the embodiment illustrated in FIGS. 1-3, the first and second broadwalls 50 and 52 are formed from metallization layers 38 and 46, in the first and second redistribution layers 34 and 42, respectively. In other embodiments, examples of which will be discussed in further detail below, one or more both of the broadwalls 50 and 52 may instead be formed from a metallization layer formed on a dielectric insert embedded in the package molding compound layer 12, where at least metallization layer 38 is conductively connected to the metallization layer on the dielectric insert, to connect the RF transmission line section 40 to the first broadwall 50, via the transmission line interface section 26 and the transformer section 32.

In some embodiments, first sidewall 54 and second sidewall 56 are formed from several parallel conductors 58, as seen in FIG. 1, extending between first and second broadwalls 50 and 52. These can be formed from metallized vias through the package molding compound layer 12, in some embodiments, or from metallized vias formed through a dielectric insert embedded in the compound layer 12, in other embodiments. In the embodiment illustrated in FIGS. 1-3, first sidewall 54 conductively connects first broadwall 50 and second broadwall 52 along one side of the waveguide transition structure 24, between transmission line interface section 26 and waveguide interface section 28, while second sidewall 56 conductively connects first broadwall 50 and second broadwall 52 along an opposite side of the waveguide transition structure 24, again between transmission line interface section 26 and waveguide interface section 28. If the first and second sidewalls 54, 56 are formed from parallel conductors, these parallel conductors should touch one another or should be spaced closely to one another, where "closely" should be understood with reference to the longest wavelength of the RF signals propagated through the device, so that the series of parallel conductors effectively provides a continuous wall from an RF perspective.

In one embodiment, metallization layer 38 within first redistribution layer 34 is conductively connected to first broadwall 50, and metallization layer 46 within second redistribution layer 42 is conductively connected to second broadwall 52. In the illustrated embodiment, second redistribution layer 42 includes a line 84 that is conductively connected between terminal 86 of RF integrated circuit 20 and waveguide transition structure 24. In the illustrated embodiment, line 84 provides a ground connection for ground planes such as ground plane 88. Ground plane 88 may be connected to one or more additional ground planes, through via structures (not shown), including to ground planes in the first redistribution layer 34.

In the embodiment illustrated in FIGS. 1-3, a direction of propagation of an electromagnetic wave coupled from RF transmission line 40 to transmission line interface section 26 is in a direction 72 that is parallel to first surface 16 and the direction of propagation of the electromagnetic wave at waveguide interface section 28 is in a direction 74 that is generally parallel to the first and second surfaces 16 and 18 of the package molding compound layer 12. This is also the case with the embodiments illustrated in FIGS. 8 and 10-12, which are discussed in detail below. In other embodiments, such as those shown in FIGS. 5-7, 9, and 13, a direction of propagation of an electromagnetic wave coupled from RF transmission line 40 to transmission line interface section 26 is in a direction 72 that is parallel to the first and second surfaces 16 and 18 of the package molding compound layer 12, while a direction of propagation of the electromagnetic wave at the waveguide interface section 28 is in a direction 76 that is generally perpendicular to the first and second surfaces 16 and 18.

Figure 4:
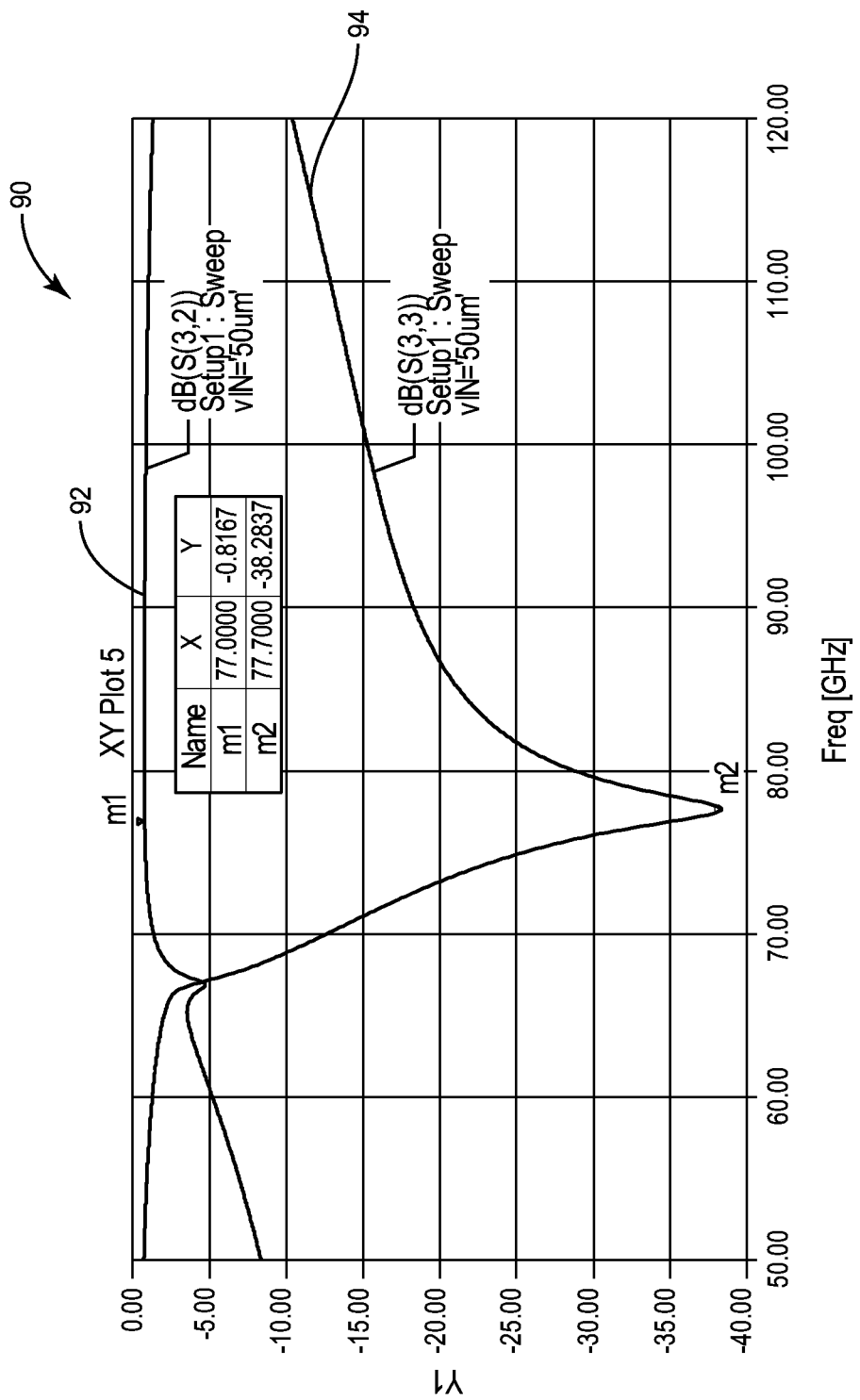
FIG. 4 illustrates the simulated insertion loss and return loss for the waveguide transition structure of FIG. 3.

With proper simulation and design of the transmission line interface section 26, the transformer section 32, and waveguide interface section 28, a low-loss transition can be obtained between the transmission line 40 and the waveguide coupled to the waveguide interface section 28 of the waveguide transition structure 24. FIG. 4 illustrates a graph 90 that shows simulated transmission and reflection performance for a coplanar waveguide transition to a rectangular waveguide for the waveguide transition structure 24 shown in FIGS. 1-3. Line 92 shows simulated transmission or insertion loss and line 94 shows simulated reflection or return loss for signals coupled to the waveguide transition structure 24, respectively, from the coplanar waveguide to rectangular waveguide, and from the rectangular waveguide to the coplanar waveguide. In this example, waveguide transition structure 24 is optimized for use at and around 77 GHz. Graph 90 illustrates that at 77 GHz, the transmission or insertion loss (line 92) is very low, at less than 1 dB, with a corresponding return loss of greater than 30 dB. It will be appreciated that FIG. 4 demonstrates very good RF performance over a very wide bandwidth, i.e., from just over 70 GHz to about 100 GHz.

Figure 5:
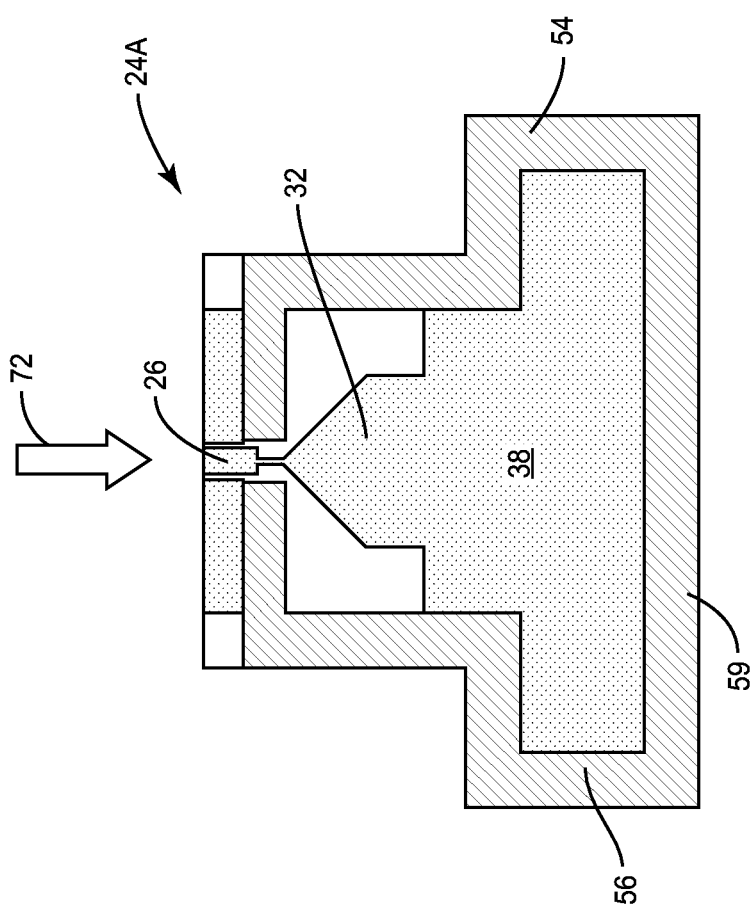
FIGS. 5-7 illustrate top and perspective views of an embodiment of the waveguide transition structure.
Figure 6:
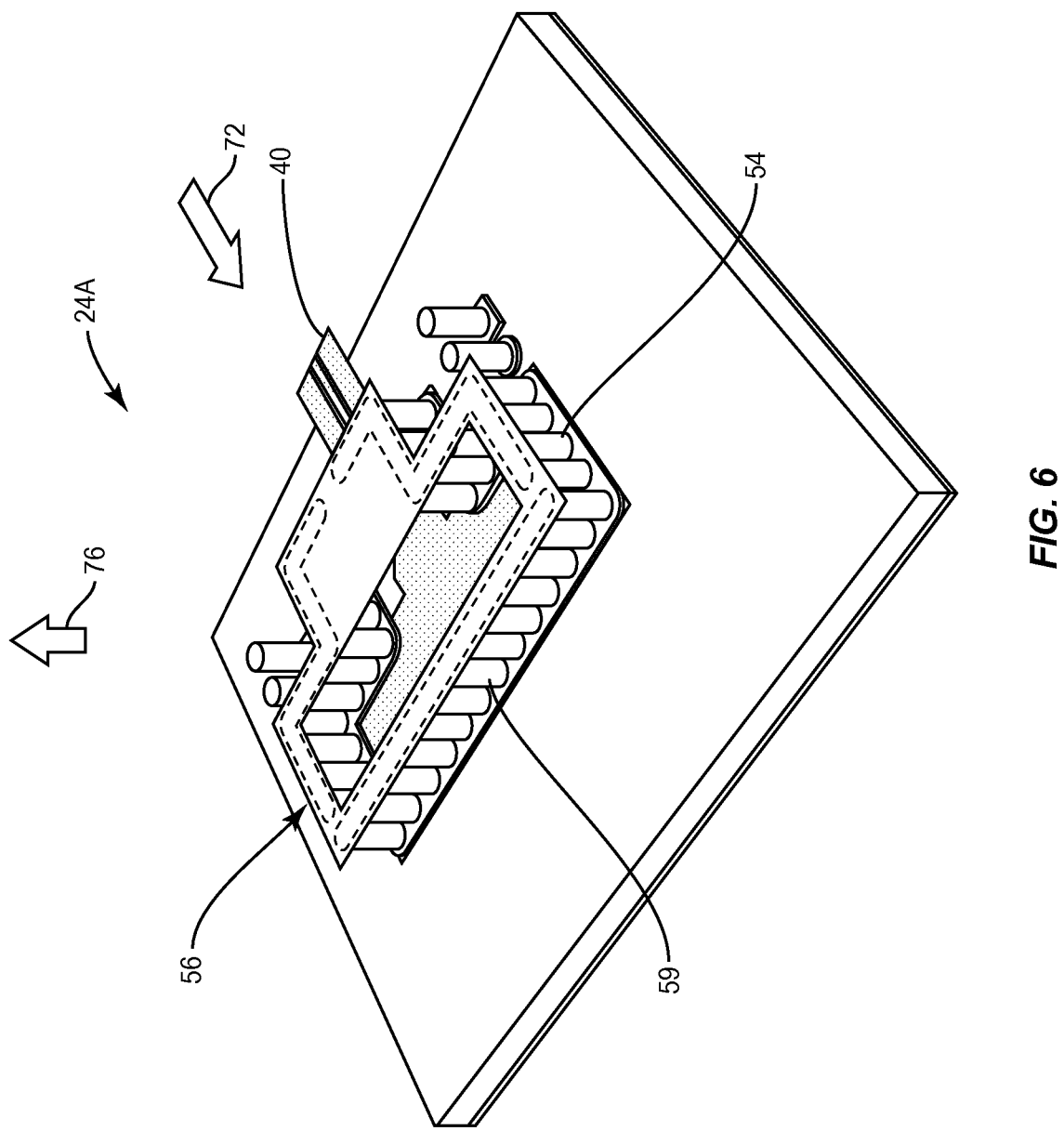
Figure 7:
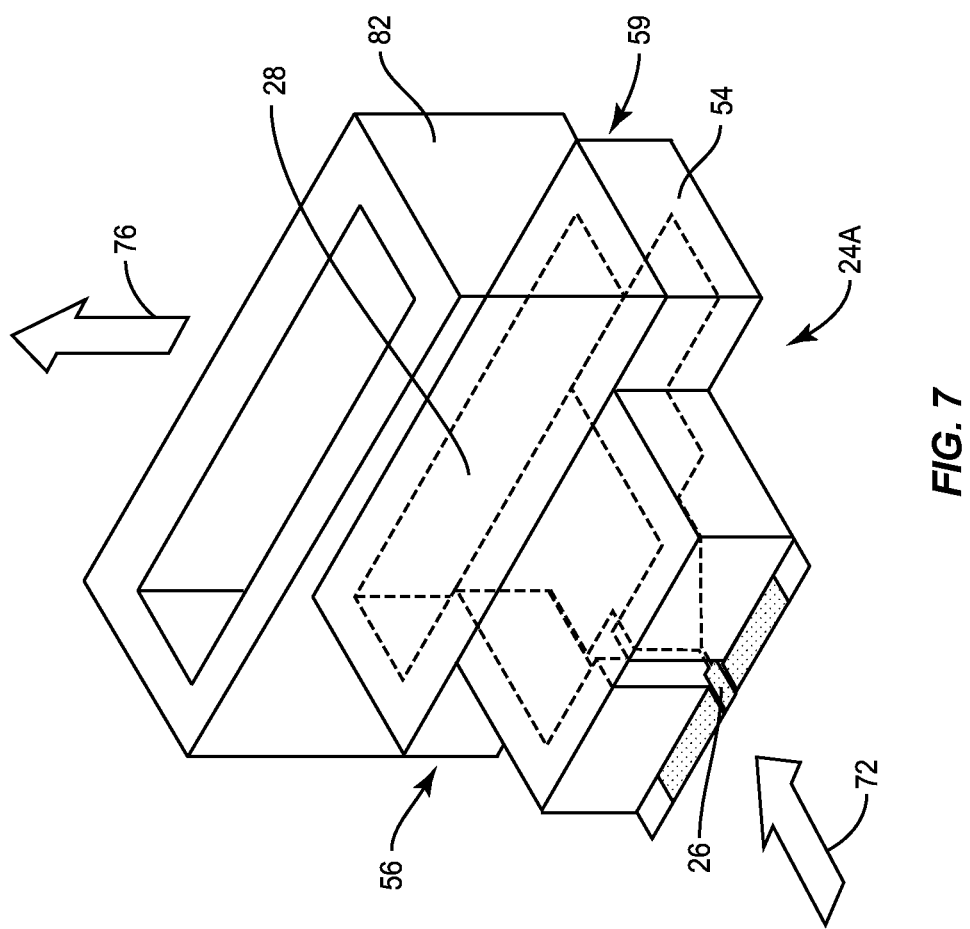

FIGS. 5-7 illustrate top and perspective views of another embodiment of a waveguide transition structure 24A. In these embodiments, the waveguide transition element 24A provides a propagation mode transition whereby the direction of propagation of an electromagnetic wave coupled from RF transmission line 40 to transmission line interface section 26 is in direction 72, which is parallel to the packaging molding compound layer's surfaces 16 and 18, while the direction of propagation of the electromagnetic wave at waveguide interface section 28 is in direction 76, which is perpendicular to the packaging molding compound layer's surfaces 14 and 16, and to the transmission line 40. FIG. 6 illustrates a three-dimensional view of waveguide transition structure 24, wherein first sidewall 54 and second sidewall 56 are formed from parallel conductors 58, which may be formed by metallized vias running between a metallization layer at the top side of transition structure 24A, where the transition structure 24A is configured to couple to a vertically oriented rectangular waveguide, and a metallization layer at the bottom side of waveguide transition structure 24A. In this embodiment, first sidewall 54 and second sidewall 56 join are joined to one another via an endwall 59, which is also constructed from a plurality of parallel conductors 58. FIG. 7 illustrates a rectangular waveguide 82 that is coupled at 30 to waveguide interface section 28.

Figure 8:
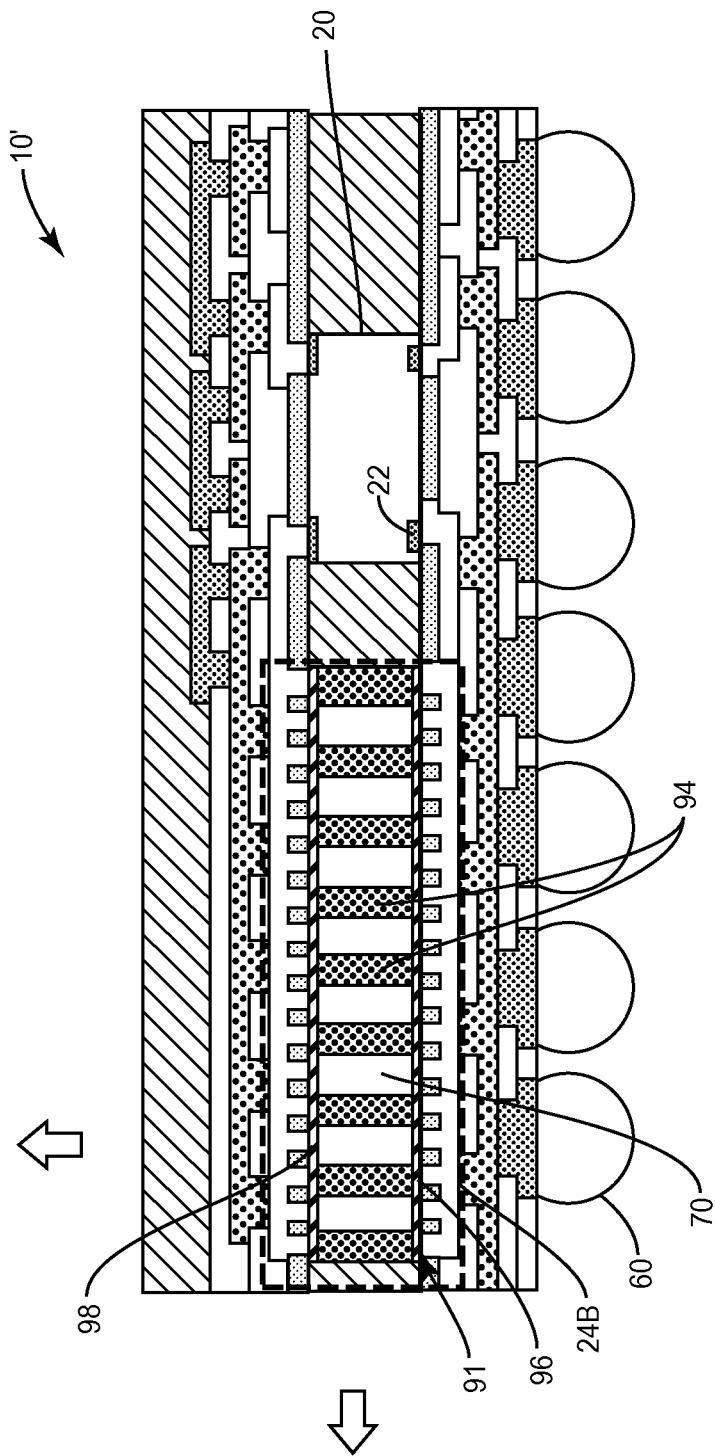
FIG. 8 illustrates a sectional side view of an embodiment of a module having an externally formed drop-in waveguide transition structure.

FIG. 8 illustrates a sectional side view of an embodiment of an integrated circuit module 10' having an externally formed, drop-in, waveguide transition structure 24B. In this embodiment, waveguide transition structure 24B comprises an insert 91, which in turn comprises a dielectric layer 70 having a top metallization 98 and a bottom metallization 96 formed thereupon, with metallized vias 94 providing a conductive interconnection between top metallization 98 and bottom metallization 96. In this embodiment, bottom metallization 96 forms a first broadwall, top metallization 98 forms a second broadwall, and vias 94 are parallel conductors that form first and sidewalls. Top metallization 98 is conductively coupled to metallization layer 46 and bottom metallization 96 is conductively coupled to metallization layer 38.

In this embodiment, waveguide transition structure 24 includes a cavity that is defined by the first broadwall, formed from bottom metallization 96, and the second broadwall, formed from top metallization layer 98, and the first and second sidewalls, formed from vias 94. Top metallization 98 is conductively coupled to metallization layer 46 in the second redistribution layer 42 and bottom metallization 96 is conductively coupled to metallization layer 38 in the first redistribution layer 34. In this embodiment, vias 94 each extend through a dielectric material 70 that is different than package molding compound 14. Dielectric material 70 may be selected from any of a variety of materials that are commonly used for forming RF printed-circuit boards, for example, and may thus provide better RF performance than is achievable with a waveguide transition structure 24 that is formed directly in the mold compound layer 12.

Figure 9:
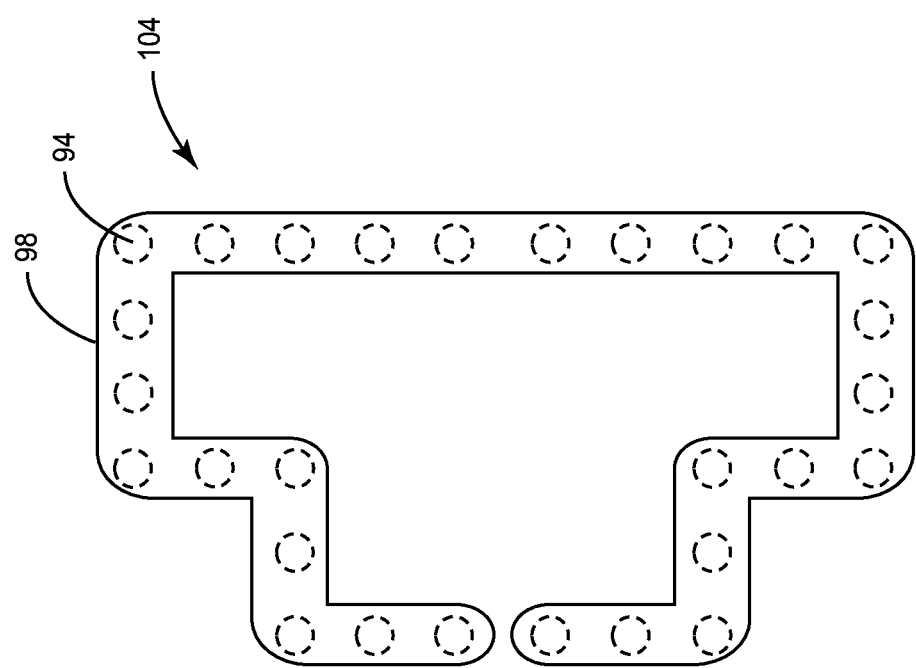
FIG. 9 illustrates a top view of an embodiment of a drop-in via structure.

FIG. 9 illustrates a top view of a via structure 104 such as might be found in an insert that is formed to provide a horizontal-to-vertical mode transition in a waveguide transaction structure. FIG. 9 can be compared to the structures shown in FIGS. 5-7, for example. Via structure 104 includes vias 94 that conductively couple a top metallization 98 to a bottom metallization 96 (not shown; refer to FIG. 8). Accordingly, when FIG. 9 is viewed together with FIG. 8, it will be appreciated that the transition structure 24B in the illustrated embodiment is defined by a first broadwall formed from metallization layer 38 in the first redistribution layer 34 and a second broadwall formed from metallization layer 46 in the second redistribution layer 42. First sidewall 54 and second sidewall 56 are formed from vias 94. Top metallization 98 is conductively coupled to metallization layer 46 in second redistribution layer 42 and bottom metallization 96 is conductively coupled to metallization layer 38 within first redistribution layer 34. It will be appreciated, however, that the first and second broadwalls may instead be realized by appropriately extending metallization layers 96 and 98 on the insert. In this case, the metallization layers 38 and 46 may fully or partially overlap the metallization layers 96 and 98, respectively, and may be conductively connected to the corresponding metallization layers 96 and 98 through metallized via structures at various places.

Figure 10:
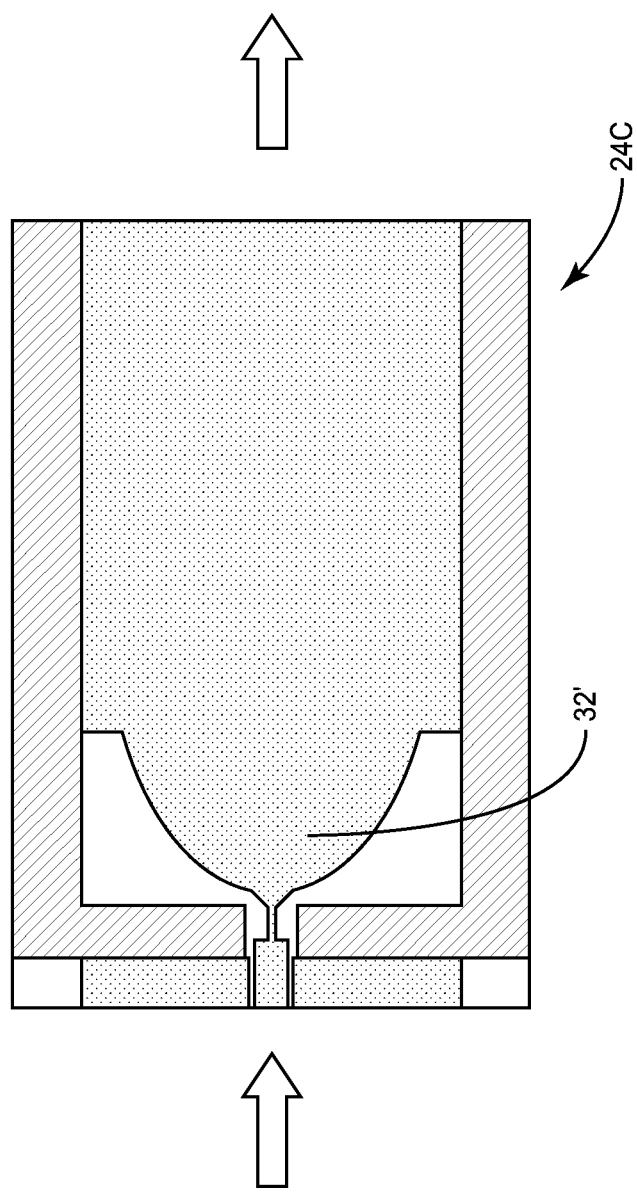

In view of the preceding discussion, it will be appreciated that several details of the waveguide transition structure may vary. For instance, the shape of the waveguide transition structure may vary, depending on the required electrical performance. FIG. 10 illustrates an example waveguide transition structure 24C wherein transformer section 32' has a curved outline, for example, as compared to the straight-edged structure in the embodiment illustrated in FIG. 2. FIGS. 11A and 11B illustrate embodiments of a waveguide transition structure 24D, where an endwall 110 joins sidewalls 54 and 56, leaving only a small opening over transmission line interface section 26. This can be compared to other embodiments where there is a gap above and adjacent to the transmission line interface section 26 (see FIG. 2). FIGS. 12A and 12B illustrate an embodiment of a waveguide transition structure 24E, where the transition is from a microstrip line 80 to the rectangular waveguide mode signal at waveguide interface section 28.

Figure 13B:
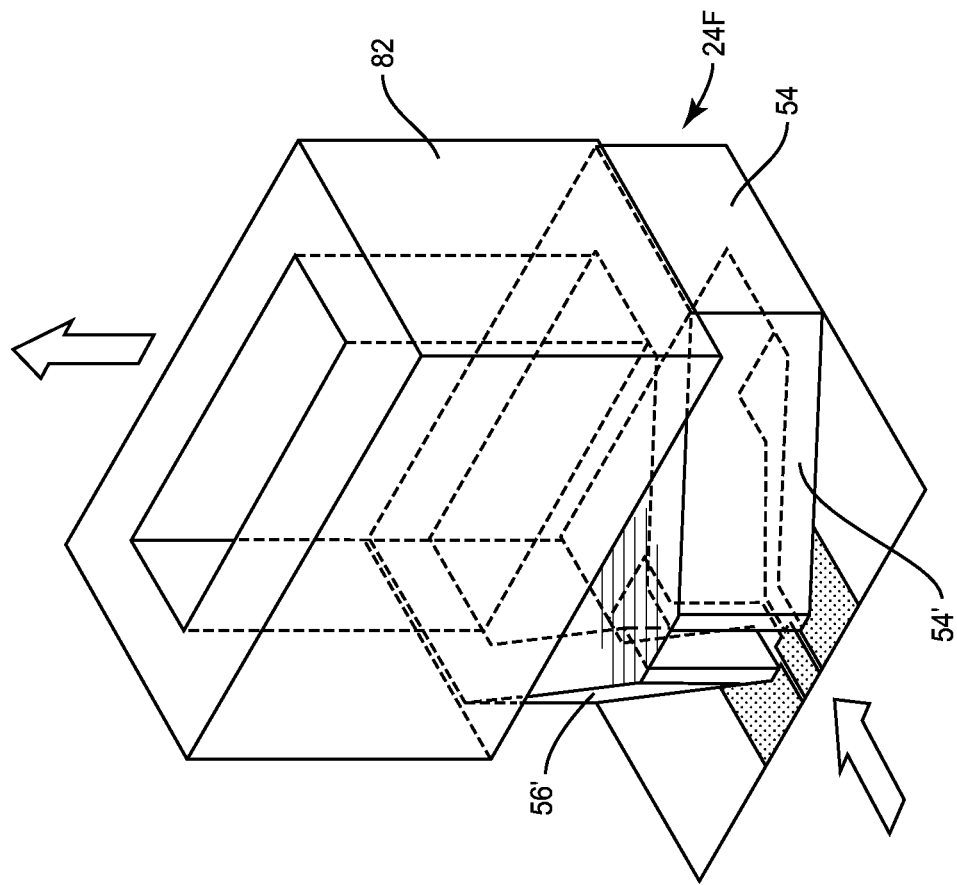
Figure 13A:
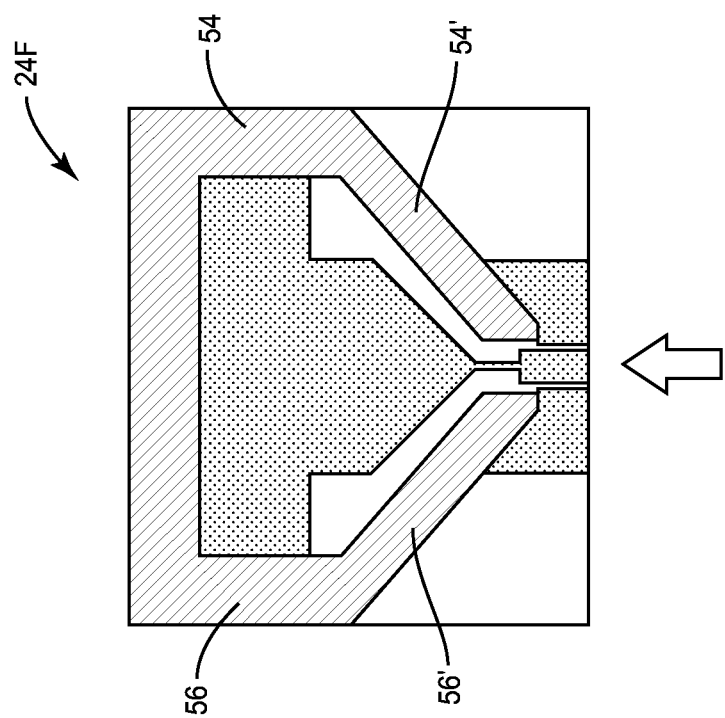
Figure 14A:
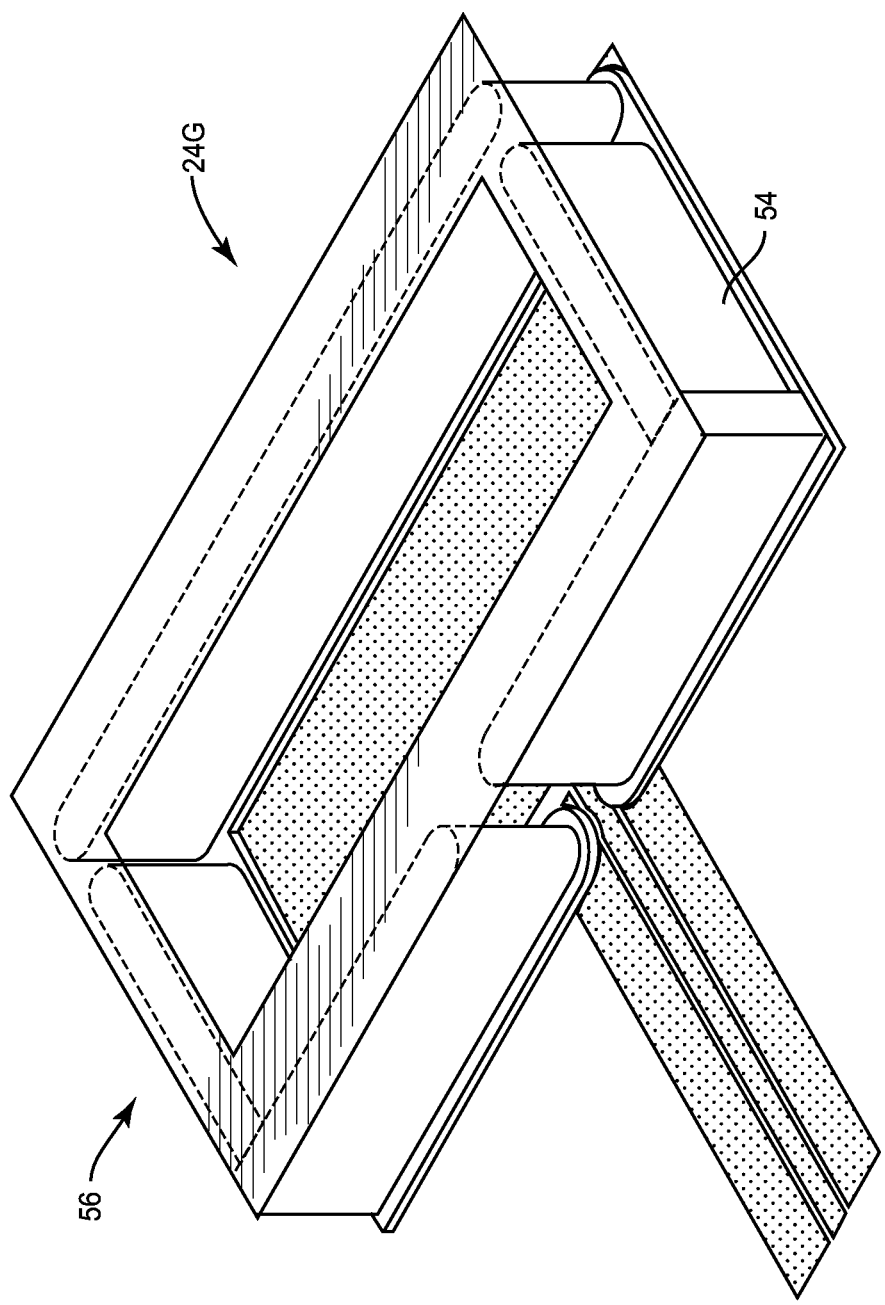
Figure 14C:
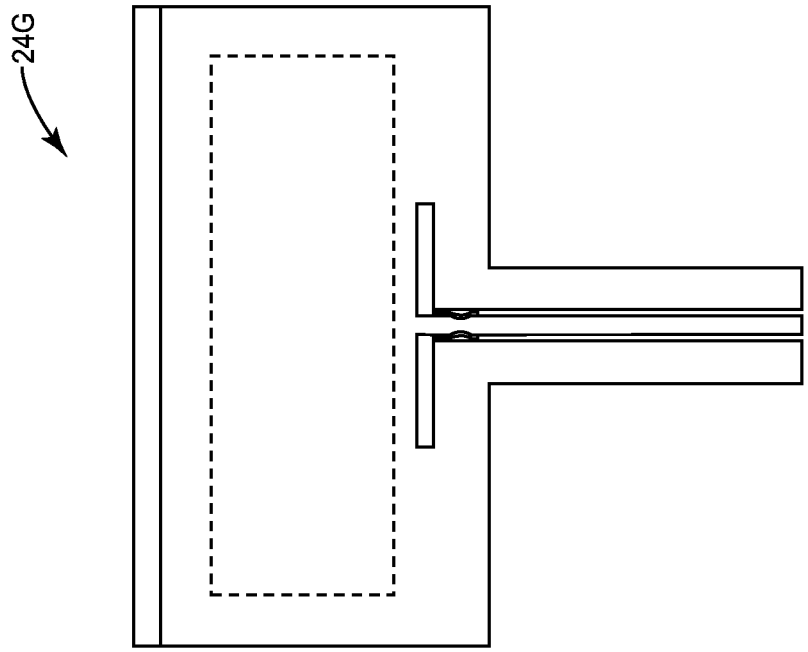
Figure 14B:
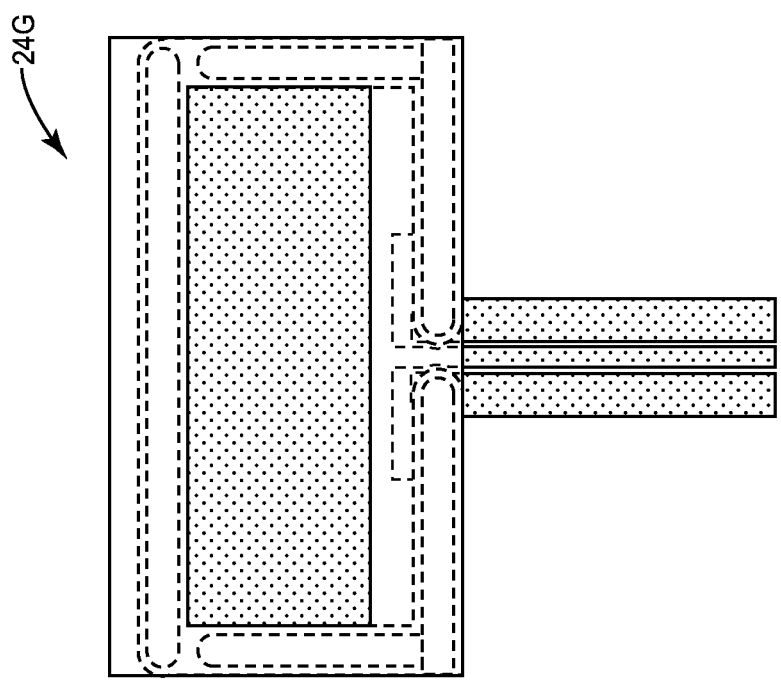
Figure 14D:
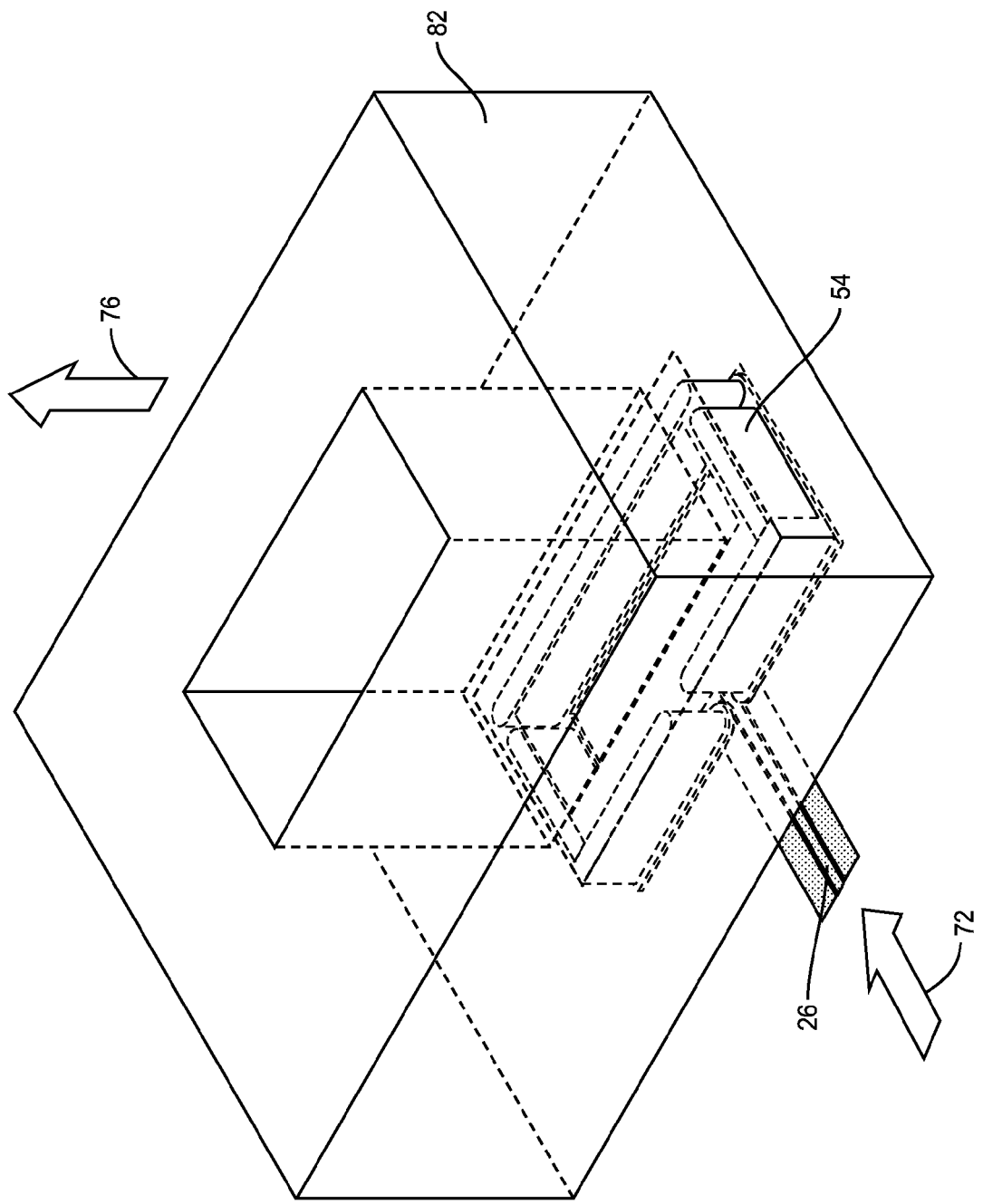

FIGS. 13A and 13B illustrate an embodiment of a waveguide transition structure 24F, where sidewalls 54 and 56 are joined to corresponding angled sidewalls 54' and 56', respectively. Waveguide transition structure includes a waveguide interface section configured to couple to a rectangular waveguide 82 extending in the vertical direction, as shown at FIG. 13B. FIGS. 14A-14D illustrate a waveguide transition structure 24F that is also configured for coupling to a rectangular waveguide 82. The transmission line interface section of waveguide transition structure 24G is configured for coupling to a co-planar waveguide, with the transformer section comprising two slots extending sideways from a termination point of the co-planar waveguide into the bottom broadwall of the structure. The transformer section in this embodiment can be understood as performing a function comparable to that of a slot antenna coupling the differential transmission line to the interior of the transition structure. It will be appreciated that a similar approach can be taken for a waveguide transition structure configured to be coupled to a differential transmission line, such as a slotline. In this case (which is not illustrated), the transformer section comprises only a single slot extending sideways from a termination point of the slotline.

More generally, it will be appreciated that the sidewalls, transition structures, transmission line interface sections, and waveguide interface sections can be modified in accordance with the desired operating frequencies, dielectric materials, desired RF performance, and other factors. For instance, the dimensions and/or shapes of any or all of these features may be modified to accommodate matching the structure to rectangular waveguides filled with different dielectric materials. Those skilled in the art of RF and microwave circuit design will appreciate that existing design tools, such as those that are based at least in part on finite-element analysis, may be used to design and simulate the waveguide transition structures so as to obtain the desired RF performance.

FIG. 15 illustrates a method of manufacturing a module 10. As shown at "A" in FIG. 14, an insert 91 and an RF integrated circuit 20 are embedded in a package molding compound 14, the package molding compound forming a package molding compound layer 12. In some embodiments, as shown in FIG. 14, the insert 91 and RF integrated circuit 20 are placed on a carrier 140, and the package molding compound 14 is disposed around the insert 91 and the RF integrated circuit 20. After the package molding compound 14 is cured, the carrier 140 can be removed.

Next, as shown at "B," a first redistribution layer 34 is formed on first surface 16 of package molding compound layer 12. First redistribution layer 34 includes at least one insulating layer 36 and at least one metallization layer 38 and extends between RF integrated circuit 20 and waveguide transition structure 24. First redistribution layer 34 includes an RF transmission line 40 that is conductively connected between the RF port 22 of the RF integrated circuit 20 and a transmission line interface section 26 (not shown) of the waveguide transition structure 24. In some embodiments, as shown at "C", a second redistribution layer 42 is formed on second surface 18 of package molding compound layer 12. Second redistribution layer 42 includes at least one insulating layer 44 and at least one metallization layer 46 and extends between RF integrated circuit 20 and waveguide transition structure 24 through line 84. In the illustrated embodiment, solder balls 60 are formed on the second redistribution layer 34; it will be appreciated that some embodiments may include only a single redistribution layer, in which case the solder balls 60 may be formed on that single redistribution layer.

In one embodiment, waveguide transition structure 24 is defined by a first broadwall formed from bottom metallization 96 and a second broadwall formed from top metallization layer 98. First and second sidewalls are formed from vias 94. Top metallization 98 is conductively coupled to metallization layer 46 within second redistribution layer 42 and bottom metallization 96 is conductively coupled to metallization layer 38 within first redistribution layer 34. In this embodiment, vias 94 each extend through a dielectric material 70 that is different than package molding compound 14.

In other embodiments, an insert 91 is not used. Instead, a waveguide transition structure 24 is defined by a first broadwall formed from metallization layer 38 within the first redistribution layer 34 and a second broadwall formed from metallization layer 46 within the second redistribution layer 42. In these embodiments, the first and second sidewalls are formed from metallized vias formed through the package molding compound layer 14.

Terms such as "same", "match" and "matches" as used herein are intended to mean identical, nearly identical, or approximately so that some reasonable amount of variation is contemplated without departing from the spirit of the invention. The term "constant" means not changing or varying, or changing or varying slightly so that some reasonable amount of variation is contemplated without departing from the spirit of the invention. Further, terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. The description of various techniques provided herein is intended to cover any adaptations or variations of the specific embodiments discussed herein. Therefore, it is intended that the present invention be limited only by the claims attached hereto and the equivalents thereof.

What is claimed is:

1. A integrated-circuit module, comprising:
a package molding compound layer comprising a package molding compound and having opposing first and second surfaces;
a radio-frequency (RF) integrated circuit embedded in the package molding compound and including an RE port;
a waveguide transition structure embedded in the package molding compound and including a transmission line interface section, a waveguide interface section configured for coupling to a rectangular waveguide housing, and a transformer section configured to provide a propagation mode transition between the transmission line interface section and the waveguide interface section; and
a first redistribution layer comprising least one insulating layer and at least one metallization layer and extending between the RF integrated circuit and the waveguide transition structure across the first surface of the package molding compound layer, the first redistribution layer further comprising an RF transmission line that is conductively connected between the RF port of the RF integrated circuit and the transmission line interface section of the waveguide transition structure.

2. The integrated-circuit module of claim 1, further comprising a second redistribution layer comprising at least one insulating layer and at least one metallization layer and extending between the RF integrated circuit and the waveguide transition structure across the second surface of the package molding compound layer, wherein the waveguide transition structure has a cavity defined by a first broadwall formed from the at least one metallization layer within the first redistribution layer, a second broadwall formed from the at least one metallization layer within the second redistribution layer, and first and second sidewalls, each formed from one or more conductors that conductively couple the first broadwall to the second broadwall between first and second sides of the transmission line interface section and respective first and second sides of the waveguide interface section, and wherein one of the broadwalls is conductively coupled to the RF port of the RF integrated circuit, via the RF transmission line and the transmission line interface section, and the other broadwall is conductively coupled to a ground terminal of the RF integrated circuit.

3. The integrated-circuit module of claim 1, wherein the waveguide transition structure further comprises a cavity defined by conductive first and second broadwalls that are parallel to the first surface and first and second sidewalls that are perpendicular to the first surface, wherein the first and second sidewalls are formed from a plurality of parallel conductors that conductively couple the first broadwall to the second broadwall between first and second sides of the transmission line interface section and respective first and second sides of the waveguide interface section.

4. The integrated-circuit module of claim 3, wherein the plurality of parallel conductors that form each of the first sidewall and the second sidewall comprise conductive via structures that extend through the package molding compound to conductively couple the first broadwall to the second broadwall.

5. The integrated-circuit module of claim 3, wherein the one or more conductors that form each of the first sidewall and the second sidewall extend through a dielectric material, differing from the package molding compound, to conductively couple the first broadwall to the second broadwall.

6. The integrated-circuit module of claim 5, wherein metallization on first and second surfaces of the dielectric material define conductive first and second broadwalls of the waveguide transition structure, and wherein the at least one metallization layer in the first redistribution layer is conductively coupled to the first broadwall.

7. The integrated-circuit module of claim 1, wherein the waveguide transition e further comprises a cavity defined by conductive first and second broadwalls that are parallel to the first surface, and first and second sidewails that are perpendicular to the first surface, wherein each of first and second sidewall is formed from a plurality of parallel conductors that conductively couple the first broadwall to the second broadwall between first and second sides of the transmission line interface section and respective first and second sides of the waveguide interface section.

8. The integrated-circuit module of claim 7, further comprising a second redistribution layer comprising at least one insulating layer and at least one metallization layer and extending between the RF integrated circuit and the waveguide transition structure across the second surface of the package molding compound layer, wherein the at least one metallization layer within the first redistribution layer is conductively connected to the first broadwall, and wherein the at least one metallization layer within the second redistribution layer is conductively connected to the second broadwall, and wherein at least one of the at least one metallization layer within the first redistribution layer and the at least one metallization layer within the second redistribution layer is conductively connected to the RF port of the RF integrated circuit, via the trasmission line interface section and the RF transmission line.

9. The integrated-circuit module of claim 1, wherein the waveguide transition structure is configured so that a direction of propagation of an electromagnetic wave coupled from the RF transmission line to the transmission line interface section is in a direction that is generally parallel to the first surface, while the direction of propagation of the electromagnetic wave at the waveguide interface section is in a direction that is generally perpendicular to the first surface.

10. The integrated-circuit module of caim 1, wherein the waveguide transition structure is configured so that a direction of propagation of an electromagnetic wave coupled from the RF transmission line to the transmission line interface section is in a direction that is generally parallel to the first surface and the direction of propagation of the electromagnetic wave at the waveguide interface section is in the direction that is generally parallel to the first surface.

11. The integrated-circuit module of claim 1, wherein the propagation mode transition is between a transverse electromagnetic (TEM) mode or quasi-TEM mode at the transmission line interface section to a waveguide propagation mode at the waveguide interface section.

12. The integrated-circuit module of claim 1, wherein the RF transmission line is a coplanar waveguide transmission line.

13. The integrated-circuit module of claim 1, wherein the RF transmission line is a microstrip transmission line or a grounded coplanar waveguide transmission line.

14. The integrated-circuit module of claim 1, where the RF transmission line is a differential transmission line and the transmission line interface section couples the differential transmission line to the transformer section.

15. A method of fabricating an integrated-circuit module, comprising:
providing a radio-frequency (RF) integrated circuit having an RF port and providing a waveguide transition structure having a transmission line interface section, a waveguide interface section configured for coupling to a rectangular waveguide housing, and a transformer section configured to provide a mode transition between the transmission line interface section and the waveguide interface section, wherein the RF integrated circuit and the waveguide transition structure are embedded in a package molding compound layer such that package molding compound is disposed around the RF integrated circuit and the waveguide transition structure; and
forming a first redistribution layer on the first surface of the package molding compound layer, the first redistribution layer comprising at least one insulating layer and at least one metallization layer and extending between the RF integrated circuit and the waveguide transition structure, and further comprising an RF transmission line conductively connected between the RF port of the RF integrated circuit and the transmission line interface section of the waveguide transition structure.

16. The method of claim 15, further comprising forming a second redistribution layer on the second surface of the package molding compound layer, the second redistribution layer comprising at least one insulating layer and at least one metallization layer and extending between the RF integrated circuit and the waveguide transition structure, such that the waveguide transition structure has a cavity defined by a first broadwall formed from the at least one metallization layer within the first redistribution layer, a second broadwall formed from the at least one metallization layer within the second redistribution layer, and first and second sidewalk, each formed from one or more conductors that conductively couple the first broadwall to the second broadwall between first and second sides of the transmission line interface section and respective first and second sides of the waveguide interface section, and wherein one of the broadwalls is conductively coupled to the RF port of the RF integrated circuit, via the RF transmission line and the transmission line interface section, and the other broadwall is conductively coupled to a ground terminal of the RF integrated circuit.

17. The method of claim 15, wherein the waveguide transition structure further comprises a cavity defined by conductive first and second broadwalls that are parallel to the first surface and first and second sidewalls that are perpendicular to the first surface, wherein the first and second sidewalls are formed from a plurality of parallel conductors that conductively couple the first broadwall to the second broadwall between first and second sides of the transmission line interface section and respective first and second sides of the waveguide interface section.

18. The method of claim 17, further comprising: forming a second redistribution layer on the second surface of the package molding compound layer, wherein the second redistribution layer comprises at least one insulating layer and at least one metallization layer and extends between the RF integrated circuit and the waveguide transition structure, wherein the at least one metallization layer within the first redistribution layer is conductively connected to the first broadwall, and wherein the at least one metallization layer within the second redistribution layer is conductively connected to the second broadwall, and wherein at least one of the at least one metallization layer within the first redistribution layer and the at least one metallization layer within the second redistribution layer are conductively connected to a ground terminal of the RF integrated circuit.

* * * * *